(12) United States Patent
Yu

(10) Patent No.: US 11,341,888 B2
(45) Date of Patent: May 24, 2022

(54) DISPLAY PANEL

(71) Applicant: Wuhan China Star Optoelectronics Technology Co., LTD., Hubei (CN)

(72) Inventor: Pengfei Yu, Hubei (CN)

(73) Assignee: WUHAN CHINA STAR OPTOELECTRONICS TECHNOLOGY CO., LTD., Hubei (CN)

( * ) Notice: Subject to any disclaimer, the term of this patent is extended or adjusted under 35 U.S.C. 154(b) by 386 days.

(21) Appl. No.: 16/485,432

(22) PCT Filed: Apr. 25, 2019

(86) PCT No.: PCT/CN2019/084351
§ 371 (c)(1),
(2) Date: Aug. 12, 2019

(87) PCT Pub. No.: WO2020/107794
PCT Pub. Date: Apr. 6, 2020

(65) Prior Publication Data
US 2021/0366342 A1    Nov. 25, 2021

(30) Foreign Application Priority Data
Nov. 29, 2018  (CN) .......................... 201811442873.2

(51) Int. Cl.
*G03F 7/07*      (2006.01)
*G09G 3/20*     (2006.01)
*G03F 7/00*     (2006.01)

(52) U.S. Cl.
CPC ......... *G09G 3/2003* (2013.01); *G03F 7/0007* (2013.01); *G09G 2300/0439* (2013.01)

(58) Field of Classification Search
CPC .......... G09G 3/2003; G09G 2300/0439; G03F 7/0007
See application file for complete search history.

(56) References Cited

U.S. PATENT DOCUMENTS

2017/0102581 A1* 4/2017 Peng .................. G02F 1/134309
2019/0011830 A1* 1/2019 Ji ........................ H01L 27/3246

* cited by examiner

*Primary Examiner* — Towfiq Elahi
(74) *Attorney, Agent, or Firm* — Benesch, Friedlander, Coplan & Aronoff LLP

(57) ABSTRACT

A display panel is provided. A plurality of target sub-pixels of the display panel in a pixel arrangement direction, and located in a first area and adjacent to a second area have a same luminous color. The first area and the second area correspondingly correspond to a light color area and a dark color area in an electrical testing screen. In this way, when an alignment precision inspection technique is performed based on an electrical testing screen, luminous colors of sub-pixels affecting colors of border lines are same. Therefore, the border lines having different colors caused by photoresists having different colors do not occur.

18 Claims, 3 Drawing Sheets

DISPLAY PANEL

FIELD OF INVENTION

The present disclosure relates to a technical field of displays, and more particularly to a display panel.

BACKGROUND OF INVENTION

In order to realize monitoring a situation of opposite assembly of an assembled backlight of display modules, an existing technique uses a method that adds an electrical testing screen to monitor the situation of opposite assembly of the assembled backlight. As specifically shown in FIG. 1, the electrical testing screen is added. The electrical testing screen is black with a white frame, and is also called a border line screen. An electrical testing inspection personnel monitors opposite assembly precision of a product by observing an offset situation of white border lines. A width of a border line is a sum of widths of six photoresists.

As shown in FIG. 2, because an arrangement order of sub-pixels of a color filter substrate is red (R), green (G), and blue (B), an arrangement order of pixels of a left side border line 21 and an arrangement order of pixels of a right side border line 22 are both R, G, and B. Photoresists (i.e. 23a and 23b in FIG. 2) under the screen and located at where edges of the corresponding white border lines and corresponding edges of a black area meet are correspondingly a B photoresist and an R photoresist. In this way, human visual perception feels the left side border line 21 is bluish, and the right side border line 22 is reddish, affecting accuracy of judgment of electrical testing inspection personnel.

That is, an existing alignment precision inspection technique that performs inspection of alignment precision of a backlight and a display panel based on an electrical testing screen has a technical problem that border lines have different colors caused by photoresists having different colors.

SUMMARY OF INVENTION

The present disclosure provides a display panel to solve the technical problem existing in the existing alignment precision inspection technique, wherein the technical problem is border lines having different colors caused by photoresists having different colors.

In order to solve the aforementioned problem, the present disclosure provides the following technical solution.

An embodiment of the present disclosure provides a display panel, including: a first area and a second area, wherein a plurality of target sub-pixels in a pixel arrangement direction, and located in the first area and adjacent to the second area have a same luminous color, and wherein the first area corresponds to a light color area in an electrical testing screen, the second area corresponds to a dark color area in the electrical testing screen, and the electrical testing screen is for inspecting an opposite assembly precision of the display panel and a backlight.

In the display panel of the present disclosure, the luminous color of the target sub-pixels is any of red light, green light, and blue light.

In the display panel of the present disclosure, the first area surrounds the second area, wherein in the pixel arrangement direction, the first area includes a first side area and a second side area opposite to each other, and the first side area and the second side area have a same width, and wherein an arrangement order of sub-pixels in the first side area is axisymmetric with an arrangement order of sub-pixels in the second side area.

In the display panel of the present disclosure, in the first side area, an arrangement order of color resists on a color filter substrate is red, green, and blue, and an arrangement order of input signals of data lines of the sub-pixels on an array substrate is red, green, and blue, and wherein in the second side area, an arrangement order of color resists on the color filter substrate is blue, green, and red, and an arrangement order of input signals of data lines of the sub-pixels on the array substrate is blue, green, and red.

In the display panel of the present disclosure, in the first side area, an arrangement order of color resists on a color filter substrate is green, red, and blue, and an arrangement order of input signals of data lines of the sub-pixels on an array substrate is green, red, and blue, and wherein in the second side area, an arrangement order of color resists on the color filter substrate is blue, red, and green, and an arrangement order of input signals of data lines of the sub-pixels on the array substrate is blue, red, and green.

In the display panel of the present disclosure, in the first side area, an arrangement order of color resists on a color filter substrate is blue, green, and red, and an arrangement order of input signals of data lines of the sub-pixels on an array substrate is blue, green, and red, and wherein in the second side area, an arrangement order of color resists on the color filter substrate is red, green, and blue, and an arrangement order of input signals of data lines of the sub-pixels on the array substrate is red, green, and blue.

In the display panel of the present disclosure, in the first side area, an arrangement order of color resists on a color filter substrate is green, blue, and red, and an arrangement order of input signals of data lines of the sub-pixels on an array substrate is green, blue, and red, and wherein in the second side area, an arrangement order of color resists on the color filter substrate is red, blue, and green, and an arrangement order of input signals of data lines of the sub-pixels on the array substrate is red, blue, and green.

In the display panel of the present disclosure, in the first side area, an arrangement order of color resists on a color filter substrate is blue, red, and green, and an arrangement order of input signals of data lines of the sub-pixels on an array substrate is blue, red, and green, and wherein in the second side area, an arrangement order of color resists on the color filter substrate is green, red, and blue, and an arrangement order of input signals of data lines of the sub-pixels on the array substrate is green, red, and blue.

In the display panel of the present disclosure, in the first side area, an arrangement order of color resists on a color filter substrate is red, blue, and green, and an arrangement order of input signals of data lines of the sub-pixels on an array substrate is red, blue, and green, and wherein in the second side area, an arrangement order of color resists on the color filter substrate is green, blue, and red, and an arrangement order of input signals of data lines of the sub-pixels on the array substrate is green, blue, and red.

In the display panel of the present disclosure, the first area surrounds the second area, wherein in the pixel arrangement direction, the first area includes a first side area and a second side area opposite to each other, and the first side area and the second side area have a same width, and wherein the luminous color of the target sub-pixels is green light.

In the display panel of the present disclosure, the first area surrounds the second area, wherein in the pixel arrangement direction, the first area includes a first side area and a second side area opposite to each other, and the first side area and the second side area have different widths, and wherein an arrangement order of sub-pixels in the first side area is same as an arrangement order of sub-pixels in the second side area.

In the display panel of the present disclosure, in the pixel arrangement direction, an arrangement order of color resists on a color filter substrate is red, green, and blue, and the luminous color of the target sub-pixels is blue light, and wherein a ratio of the width of the first side area to the width of the second side area is 3m:(3n+1), where m and n are positive integers.

In the display panel of the present disclosure, the width of the first side area is equal to a width of six photoresists, and the width of the second side area is equal to a width of seven photoresists.

In the display panel of the present disclosure, the width of the first side area is equal to a width of three photoresists, and the width of the second side area is equal to a width of four photoresists.

In the display panel of the present disclosure, in the pixel arrangement direction, an arrangement order of color resists on a color filter substrate is red, green, and blue, and the luminous color of the target sub-pixels is green light, and wherein a ratio of the width of the first side area to the width of the second side area is (3m+2):(3n+2), where m and n are positive integers.

In the display panel of the present disclosure, the width of the first side area is equal to a width of five photoresists, and the width of the second side area is equal to a width of eight photoresists.

In the display panel of the present disclosure, the width of the first side area is equal to a width of eight photoresists, and the width of the second side area is equal to a width of five photoresists.

In the display panel of the present disclosure, in the pixel arrangement direction, an arrangement order of color resists on a color filter substrate is red, green, and blue, and the luminous color of the target sub-pixels is red light, and wherein a ratio of the width of the first side area to the width of the second side area is (3m+1):3n, where m and n are positive integers.

In the display panel of the present disclosure, the width of the first side area is equal to a width of four photoresists, and the width of the second side area is equal to a width of six photoresists.

In the display panel of the present disclosure, the width of the first side area is equal to a width of four photoresists, and the width of the second side area is equal to a width of three photoresists.

Advantages effects of the present disclosure: The present disclosure provides a novel display panel including a first area and a second area. A plurality of target sub-pixels in a pixel arrangement direction, and located in the first area and adjacent to the second area have a same luminous color. The first area corresponds to a light color area in an electrical testing screen, the second area corresponds to a dark color area in the electrical testing screen, and the electrical testing screen is for inspecting an opposite assembly precision of the display panel and a backlight. As a result, the target sub-pixels located in the first area and adjacent to the second area have the same luminous color. In this way, when an alignment precision inspection technique that performs inspection of alignment precision of the backlight and the display panel is performed based on an electrical testing screen, luminous colors of sub-pixels affecting colors of border lines are same. Therefore, the border lines having different colors caused by photoresists having different colors do not occur. The technical problem existing in the existing alignment precision inspection technique is solved, wherein the technical problem is border lines having different colors caused by photoresists having different colors. Accuracy of judgment of electrical testing inspection personnel is ensured.

DESCRIPTION OF DRAWINGS

In order to describe a technical solution in embodiments or existing technology more clearly, drawings required to be used by the embodiments are briefly introduced below. Obviously, the drawings in the description below are only some embodiments of the present disclosure. With respect to persons of ordinary skill in the art, under a premise that inventive efforts are not made, other drawings may be obtained based on these drawings.

DETAILED DESCRIPTION OF PREFERRED EMBODIMENTS

Figure 1:
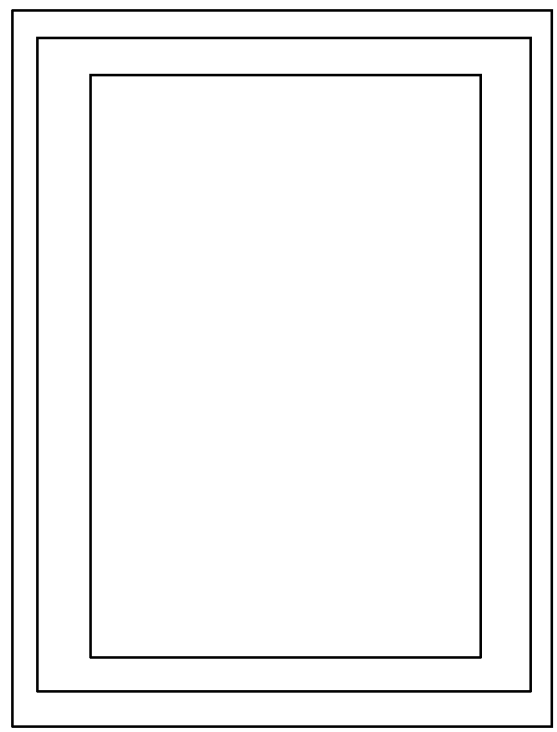
FIG. 1 is a schematic diagram of an existing electrical testing screen.
Figure 2:
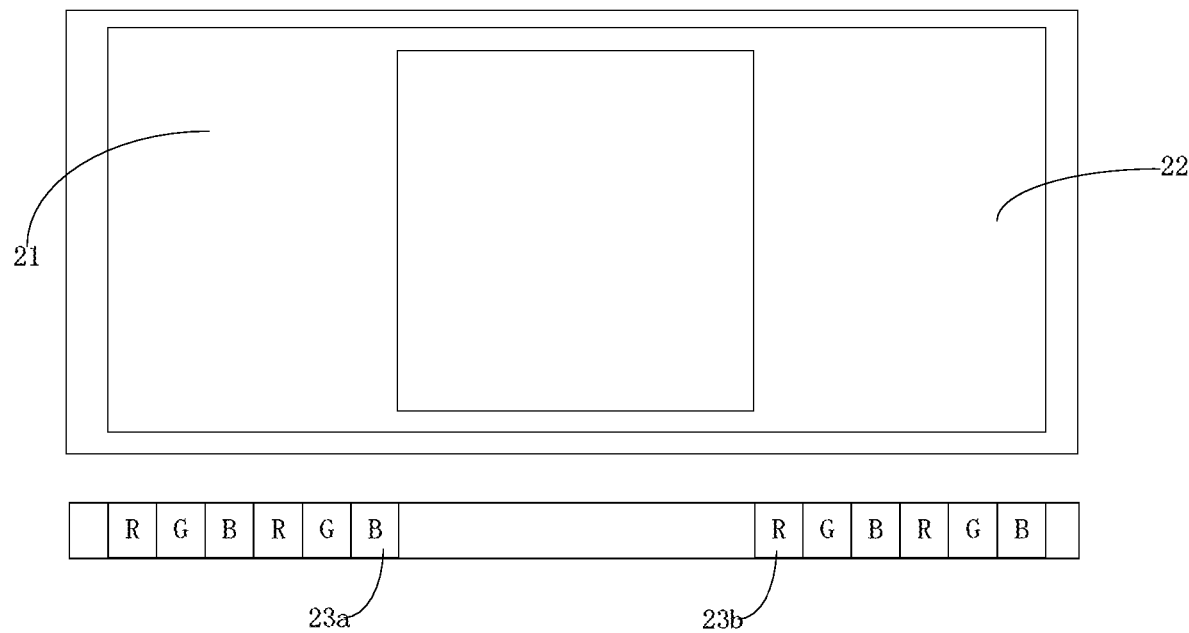
FIG. 2 is a schematic layout diagram of photoresists of an existing display panel.

The description of each embodiment below refers to respective accompanying drawing(s), to illustrate exemplarily specific embodiments of the present disclosure that may be practiced. Directional terms mentioned in the present disclosure, such as "upper", "lower", "front", "back", "left", "right", "inner", "outer", "side", etc., are only directions by referring to the accompanying drawings, and thus the used directional terms are used to describe and understand the present disclosure, but the present disclosure is not limited thereto. In the drawings, structurally similar units are labeled by the same reference numerals.

Embodiments of the present disclosure solves the technical problem existing in the existing alignment precision inspection technique, wherein the technical problem is border lines having different colors caused by photoresists having different colors.

Figure 3:
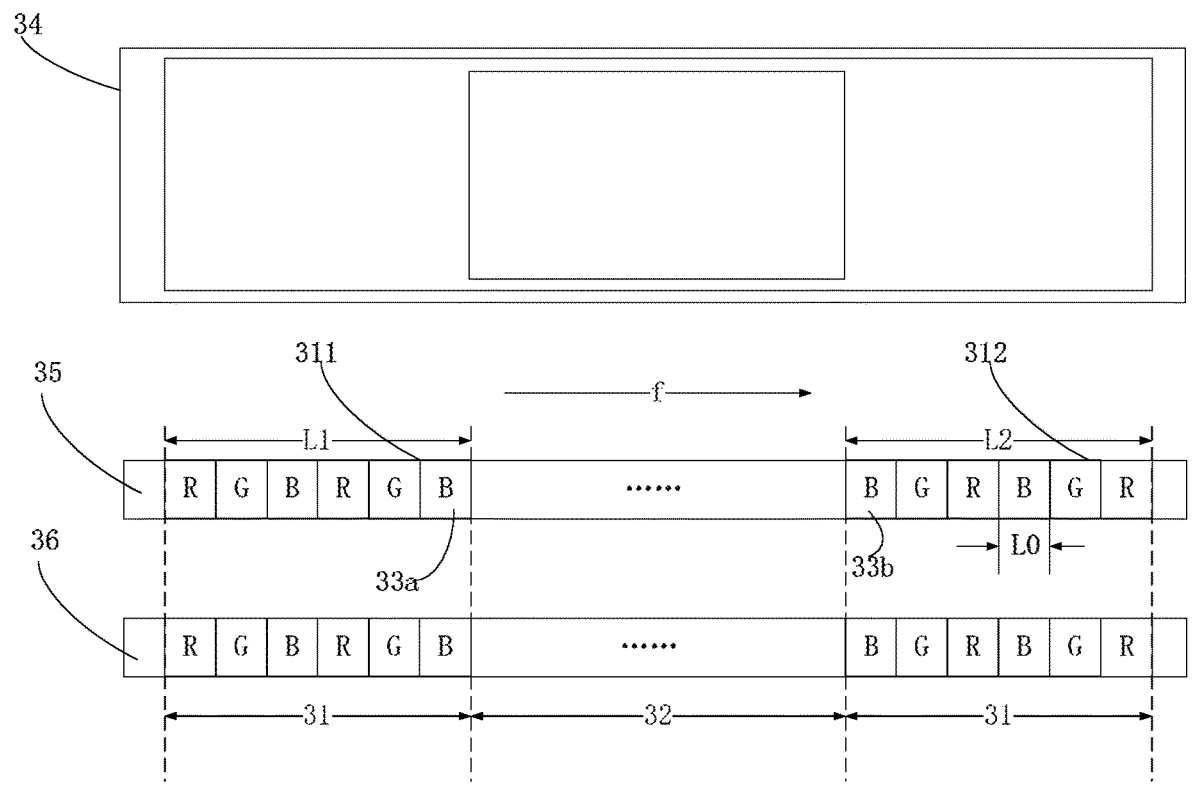
FIG. 3 is a first schematic layout diagram of a display panel in accordance with an embodiment of the present disclosure.

In an embodiment, as illustrated in FIG. 3, the present disclosure provides a display panel 3 including a first area 31 and a second area 32. A plurality of target sub-pixels (including two columns such as a sub-pixel 33a and a sub-pixel 33b) in a pixel arrangement direction, and located in the first area and adjacent to the second area have a same luminous color. The first area 31 corresponds to a light color area 341 (usually a white border line) in an electrical testing screen 34, the second area 32 corresponds to a dark color area 342 (usually a black area) in the electrical testing screen 34, and the electrical testing screen 34 is for inspecting an opposite assembly precision of the display panel and a backlight.

The present disclosure provides a novel display panel including a first area and a second area. A plurality of target sub-pixels in a pixel arrangement direction, and located in the first area and adjacent to the second area have a same luminous color. The first area corresponds to a light color area in an electrical testing screen, the second area corresponds to a dark color area in the electrical testing screen, and the electrical testing screen is for inspecting an opposite assembly precision of the display panel and a backlight. As a result, the target sub-pixels located in the first area and adjacent to the second area have the same luminous color. In this way, when an alignment precision inspection technique that performs inspection of alignment precision of the backlight and the display panel is performed based on an electrical testing screen, luminous colors of sub-pixels affecting colors of border lines are same. Therefore, the border lines having different colors caused by photoresists having different colors do not occur. The technical problem existing in the existing alignment precision inspection technique is solved, wherein the technical problem is border lines having different colors caused by photoresists having different colors. Accuracy of judgment of electrical testing inspection personnel is ensured.

In an embodiment, the luminous color of the target sub-pixels is any of red light, green light, and blue light.

The present disclosure may be implemented by at least two aspects. For example, an arrangement of pixels in the first area may be modified, or a width of the first area may be adjusted (in this case, a corresponding electrical testing screen needs to be modified). Different embodiments are combined below to describe different implementation manners.

In an embodiment, as illustrated in FIG. 3, the first area 31 surrounds the second area 32. In the pixel arrangement direction f, the first area includes a first side area 311 and a second side area 312 opposite to each other, and the first side area 311 has a width L1 same as a width L2 of the second side area 312. An arrangement order of sub-pixels in the first side area 311 is axisymmetric with an arrangement order of sub-pixels in the second side area 312.

In an embodiment, the first side area 311 has a width L1 same as a width L2 of the second side area 312. Both the width L1 and the width L2 are a width of six adjacent photoresists. That is, L1=L2=6*L0. In this way, the electrical testing screen does not need to be adjusted, and is compatible with an existing electrical testing platform.

In an embodiment, the first side area 311 has a width L1 same as a width L2 of the second side area 312. Both the width L1 and the width L2 are an integer multiple of a width of three adjacent photoresists. That is, L1=L2=m*3*L0, where m is a positive integer.

In an embodiment, as illustrated in FIG. 3, in the first side area 311, an arrangement order of color resists on a color filter substrate 35 is red, green, and blue, and correspondingly, an arrangement order of input signals of data lines of the sub-pixels on an array substrate 36 is red, green, and blue. In the second side area 312, an arrangement order of color resists on the color filter substrate 35 is blue, green, and red, and an arrangement order of input signals of data lines of the sub-pixels on the array substrate 36 is blue, green, and red.

In an embodiment, in the first side area 311, an arrangement order of color resists on a color filter substrate 35 is green, red, and blue, and correspondingly, an arrangement order of input signals of data lines of the sub-pixels on an array substrate 36 is green, red, and blue. In the second side area 312, an arrangement order of color resists on the color filter substrate 35 is blue, red, and green, and an arrangement order of input signals of data lines of the sub-pixels on the array substrate 36 is blue, red, and green.

In an embodiment, in the first side area 311, an arrangement order of color resists on a color filter substrate 35 is blue, green, and red, and an arrangement order of input signals of data lines of the sub-pixels on an array substrate 36 is blue, green, and red. In the second side area 312, an arrangement order of color resists on the color filter substrate 35 is red, green, and blue, and an arrangement order of input signals of data lines of the sub-pixels on the array substrate 36 is red, green, and blue.

In an embodiment, in the first side area 311, an arrangement order of color resists on a color filter substrate 35 is green, blue, and red, and an arrangement order of input signals of data lines of the sub-pixels on an array substrate 36 is green, blue, and red. In the second side area 312, an arrangement order of color resists on the color filter substrate 35 is red, blue, and green, and an arrangement order of input signals of data lines of the sub-pixels on the array substrate 36 is red, blue, and green.

In an embodiment, in the first side area 311, an arrangement order of color resists on a color filter substrate 35 is blue, red, and green, and an arrangement order of input signals of data lines of the sub-pixels on an array substrate 36 is blue, red, and green. In the second side area 312, an arrangement order of color resists on the color filter substrate 35 is green, red, and blue, and an arrangement order of input signals of data lines of the sub-pixels on the array substrate 36 is green, red, and blue.

In an embodiment, in the first side area 311, an arrangement order of color resists on a color filter substrate 35 is red, blue, and green, and an arrangement order of input signals of data lines of the sub-pixels on an array substrate 36 is red, blue, and green. In the second side area 312, an arrangement order of color resists on the color filter substrate 35 is green, blue, and red, and an arrangement order of input signals of data lines of the sub-pixels on the array substrate 36 is green, blue, and red.

An embodiment below modifies a width of a border line of an electrical testing screen, to achieve the present disclosure without modifying a pixel arrangement of a display panel.

Figure 4:
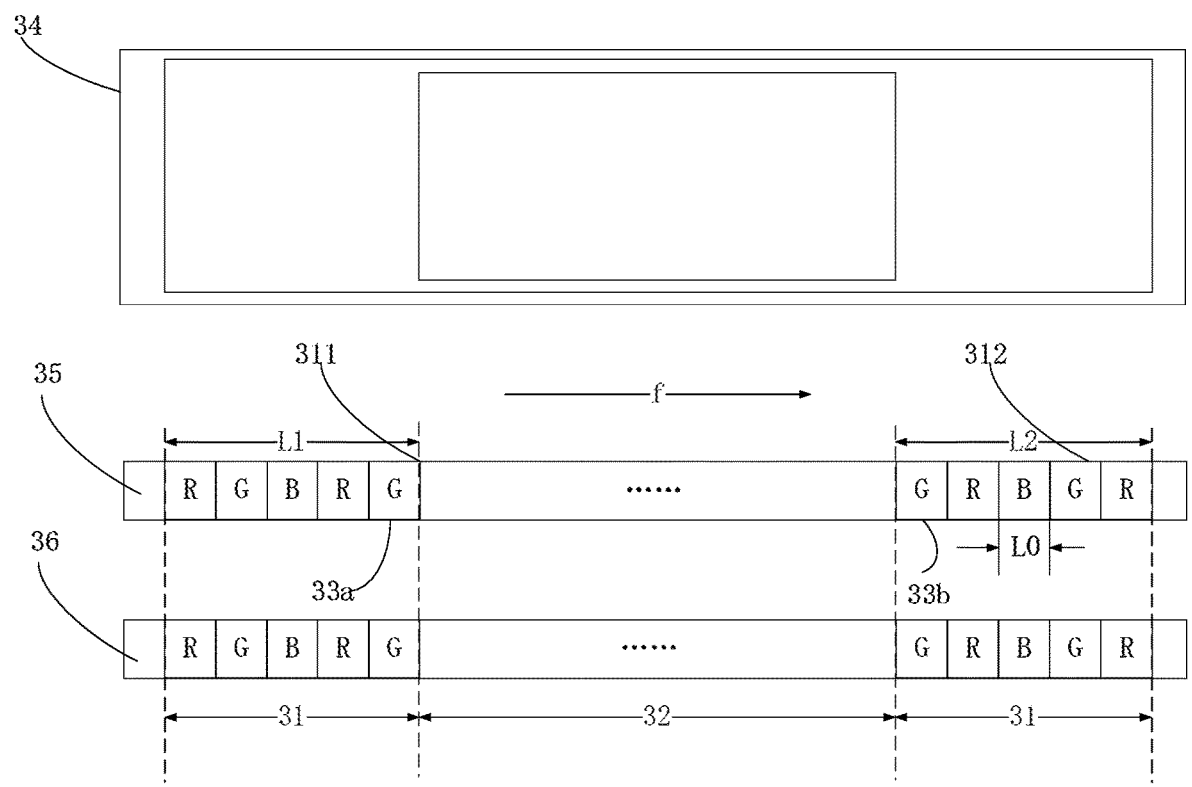
FIG. 4 is a second schematic layout diagram of a display panel in accordance with an embodiment of the present disclosure.

In an embodiment, as illustrated in FIG. 4, the first area 31 surrounds the second area 32. In the pixel arrangement direction f, the first area 31 includes a first side area 311 and a second side area 312 opposite to each other, and the first side area 311 has a width L1 same as a width L2 of the second side area 312. The luminous color of the target sub-pixels is green light. In an embodiment, an arrangement order of sub-pixels in the first side area is same as an arrangement order of sub-pixels in the second side area. Alternatively, an arrangement order of sub-pixels in the first side area 311 is axisymmetric with an arrangement order of sub-pixels in the second side area 312.

In an embodiment, the first side area 311 has a width L1 same as a width L2 of the second side area 312, and L1=L2=(m*3+2)*L0, where m is a positive integer, and L0 is a width of a single photoresist.

In an embodiment, as illustrated in FIG. 4, the first side area 311 has a width L1 same as a width L2 of the second side area 312. Both the width L1 and the width L2 are a width of five photoresists. That is, L1=L2=5*L0, where m is a positive integer, and L0 is a width of a single photoresist.

Figure 5:
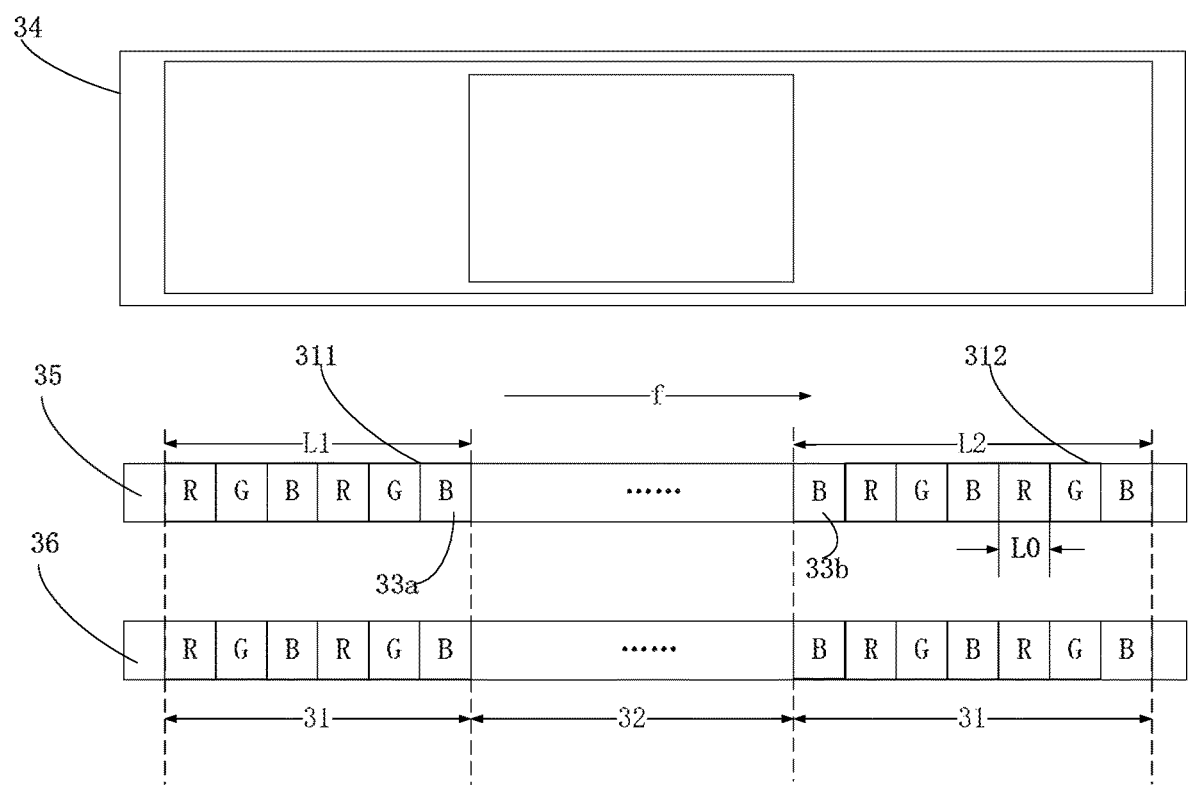
FIG. 5 is a third schematic layout diagram of a display panel in accordance with an embodiment of the present disclosure.

In an embodiment, as illustrated in FIG. 5, the first area 31 surrounds the second area 32. In the pixel arrangement direction, the first area 31 includes a first side area 311 and a second side area 312 opposite to each other, and the first side area 311 has a width L1 different from a width L2 of the second side area. An arrangement order of sub-pixels in the first side area is same as an arrangement order of sub-pixels in the second side area.

In an embodiment, as illustrated in FIG. 5, in the pixel arrangement direction f, an arrangement order of color resists on a color filter substrate is red, green, and blue, and the luminous color of the target sub-pixels is blue light. A ratio of the width L1 of the first side area to the width L2 of the second side area satisfies L1:L2=3m:(3n+1), where m and n are positive integers.

In an embodiment, as illustrated in FIG. 5, the width L1 of the first side area 311 is equal to a width of six photoresists, and the width L2 of the second side area is equal to a width of seven photoresists.

In an embodiment, the width L1 of the first side area 311 is equal to a width of three photoresists, and the width L2 of the second side area is equal to a width of four photoresists.

In an embodiment, in the pixel arrangement direction, an arrangement order of color resists on a color filter substrate is red, green, and blue, and the luminous color of the target sub-pixels is green light. A ratio of the width L1 of the first side area to the width L2 of the second side area satisfies L1:L2=(3m+2):(3n+2), where m and n are positive integers.

In an embodiment, in the pixel arrangement direction, an arrangement order of color resists on a color filter substrate is red, green, and blue, and the luminous color of the target sub-pixels is green light. The width L1 of the first side area 311 is equal to a width of five photoresists, and the width L2 of the second side area is equal to a width of eight photoresists.

In an embodiment, in the pixel arrangement direction, an arrangement order of color resists on a color filter substrate is red, green, and blue, and the luminous color of the target sub-pixels is green light. The width L1 of the first side area 311 is equal to a width of eight photoresists, and the width L2 of the second side area is equal to a width of five photoresists.

In an embodiment, in the pixel arrangement direction, an arrangement order of color resists on a color filter substrate is red, green, and blue, and the luminous color of the target sub-pixels is red light. A ratio of the width L1 of the first side area to the width L2 of the second side area satisfies L1:L2=(3m+1):3n, where m and n are positive integers.

In an embodiment, in the pixel arrangement direction, an arrangement order of color resists on a color filter substrate is red, green, and blue, and the luminous color of the target sub-pixels is red light. The width L1 of the first side area 311 is equal to a width of four photoresists, and the width L2 of the second side area is equal to a width of six photoresists.

In an embodiment, in the pixel arrangement direction, an arrangement order of color resists on a color filter substrate is red, green, and blue, and the luminous color of the target sub-pixels is red light. The width L1 of the first side area 311 is equal to a width of four photoresists, and the width L2 of the second side area is equal to a width of three photoresists.

In an embodiment, the width of the photoresist is a width of a type of photoresist on the color filter substrate.

Based on the foregoing embodiments:

The present disclosure provides a novel display panel including a first area and a second area. A plurality of target sub-pixels in a pixel arrangement direction, and located in the first area and adjacent to the second area have a same luminous color. The first area corresponds to a light color area in an electrical testing screen, the second area corresponds to a dark color area in the electrical testing screen, and the electrical testing screen is for inspecting an opposite assembly precision of the display panel and a backlight. As a result, the target sub-pixels located in the first area and adjacent to the second area have the same luminous color. In this way, when an alignment precision inspection technique that performs inspection of alignment precision of the backlight and the display panel is performed based on an electrical testing screen, luminous colors of sub-pixels affecting colors of border lines are same. Therefore, the border lines having different colors caused by photoresists having different colors do not occur. The technical problem existing in the existing alignment precision inspection technique is solved, wherein the technical problem is border lines having different colors caused by photoresists having different colors. Accuracy of judgment of electrical testing inspection personnel is ensured.

In summary, although the present disclosure has been described with preferred embodiments thereof above, it is not intended to be limited by the foregoing preferred embodiments. Persons skilled in the art can carry out many changes and modifications to the described embodiments without departing from the scope and the spirit of the present disclosure. Therefore, the protection scope of the present disclosure is in accordance with the scope defined by the claims.

What is claimed is:

1. A display panel, comprising: a first area and a second area surrounded by the first area, wherein a plurality of target sub-pixels are arranged in a pixel arrangement direction and located in the first area, and wherein the first area corresponds to a white area in an electrical testing screen, the second area corresponds to a black area in the electrical testing screen, and the electrical testing screen is for inspecting an opposite assembly precision of the display panel and a backlight,
   wherein in the pixel arrangement direction, the first area comprises a first side area and a second side area opposite to each other, and the first side area and the second side area have different widths, and wherein an arrangement order of sub-pixels in the first side area is same as an arrangement order of sub-pixels in the second side area, and
   wherein in the pixel arrangement direction, an arrangement order of color resists on a color filter array is red, green, and blue, and the luminous color of the target sub-pixels is blue light, and wherein a ratio of the width of the first side area to the width of the second side area is 3m:(3n+1), where m and n are positive integers.

2. The display panel of claim 1, wherein the luminous color of the target sub-pixels is any of red light, green light, and blue light.

3. The display panel of claim 1, wherein the first area surrounds the second area, wherein in the pixel arrangement direction, the first area comprises a first side area and a second side area opposite to each other, and the first side area and the second side area have a same width, and wherein an arrangement order of sub-pixels in the first side area is axisymmetric with an arrangement order of sub-pixels in the second side area.

4. The display panel of claim 3, wherein in the first side area, an arrangement order of color resists on a color filter array is red, green, and blue, and an arrangement order of input signals of data lines of the sub-pixels on an array substrate is red, green, and blue, and wherein in the second side area, an arrangement order of color resists on the color filter array is blue, green, and red, and an arrangement order of input signals of data lines of the sub-pixels on the array substrate is blue, green, and red.

5. The display panel of claim 3, wherein in the first side area, an arrangement order of color resists on a color filter array is green, red, and blue, and an arrangement order of input signals of data lines of the sub-pixels on an array substrate is green, red, and blue, and wherein in the second side area, an arrangement order of color resists on the color filter array is blue, red, and green, and an arrangement order of input signals of data lines of the sub-pixels on the array substrate is blue, red, and green.

6. The display panel of claim 3, wherein in the first side area, an arrangement order of color resists on a color filter array is blue, green, and red, and an arrangement order of input signals of data lines of the sub-pixels on an array substrate is blue, green, and red, and wherein in the second side area, an arrangement order of color resists on the color filter array is red, green, and blue, and an arrangement order of input signals of data lines of the sub-pixels on the array substrate is red, green, and blue.

7. The display panel of claim 3, wherein in the first side area, an arrangement order of color resists on a color filter array is green, blue, and red, and an arrangement order of input signals of data lines of the sub-pixels on an array substrate is green, blue, and red, and wherein in the second side area, an arrangement order of color resists on the color filter array is red, blue, and green, and an arrangement order of input signals of data lines of the sub-pixels on the array substrate is red, blue, and green.

8. The display panel of claim 3, wherein in the first side area, an arrangement order of color resists on a color filter array is blue, red, and green, and an arrangement order of input signals of data lines of the sub-pixels on an array substrate is blue, red, and green, and wherein in the second side area, an arrangement order of color resists on the color filter array is green, red, and blue, and an arrangement order of input signals of data lines of the sub-pixels on the array substrate is green, red, and blue.

9. The display panel of claim 3, wherein in the first side area, an arrangement order of color resists on a color filter array is red, blue, and green, and an arrangement order of input signals of data lines of the sub-pixels on an array substrate is red, blue, and green, and wherein in the second side area, an arrangement order of color resists on the color filter array is green, blue, and red, and an arrangement order of input signals of data lines of the sub-pixels on the array substrate is green, blue, and red.

10. The display panel of claim 1, wherein the first area surrounds the second area, wherein in the pixel arrangement direction, the first area comprises a first side area and a second side area opposite to each other, and the first side area and the second side area have a same width, and wherein the luminous color of the target sub-pixels is green light.

11. The display panel of claim 1, wherein the width of the first side area is equal to a width of six photoresists, and the width of the second side area is equal to a width of seven photoresists.

12. The display panel of claim 1, wherein the width of the first side area is equal to a width of three photoresists, and the width of the second side area is equal to a width of four photoresists.

13. A display panel, comprising: a first area and a second area surrounded by the first area, wherein a plurality of target sub-pixels are arranged in a pixel arrangement direction and located in the first area, and wherein the first area corresponds to a white color area in an electrical testing screen, the second area corresponds to a black area in the electrical testing screen, and the electrical testing screen is for inspecting an opposite assembly precision of the display panel and a backlight, wherein in the pixel arrangement direction, the first area comprises a first side area and a second side area opposite to each other, and the first side area and the second side area have different widths, and wherein an arrangement order of sub-pixels in the first side area is same as an arrangement order of sub-pixels in the second side area, wherein in the pixel arrangement direction, an arrangement order of color resists on a color filter array is red, green, and blue, and the luminous color of the target sub-pixels is green light, and wherein a ratio of the width of the first side area to the width of the second side area is $(3m+2):(3n+2)$, where m and n are positive integers.

14. The display panel of claim 13, wherein the width of the first side area is equal to a width of five photoresists, and the width of the second side area is equal to a width of eight photoresists.

15. The display panel of claim 13, wherein the width of the first side area is equal to a width of eight photoresists, and the width of the second side area is equal to a width of five photoresists.

16. A display panel, comprising: a first area and a second area surrounded by the first area, wherein a plurality of target sub-pixels are arranged in a pixel arrangement direction and located in the first area, and wherein the first area corresponds to a white color area in an electrical testing screen, the second area corresponds to a black area in the electrical testing screen, and the electrical testing screen is for inspecting an opposite assembly precision of the display panel and a backlight, wherein in the pixel arrangement direction, the first area comprises a first side area and a second side area opposite to each other, and the first side area and the second side area have different widths, and wherein an arrangement order of sub-pixels in the first side area is same as an arrangement order of sub-pixels in the second side area, and wherein in the pixel arrangement direction, an arrangement order of color resists on a color filter array is red, green, and blue, and the luminous color of the target sub-pixels is red light, and wherein a ratio of the width of the first side area to the width of the second side area is $(3m+1):3n$, where m and n are positive integers.

17. The display panel of claim 16, wherein the width of the first side area is equal to a width of four photoresists, and the width of the second side area is equal to a width of six photoresists.

18. The display panel of claim 16, wherein the width of the first side area is equal to a width of four photoresists, and the width of the second side area is equal to a width of three photoresists.

* * * * *